(12) United States Patent
Yu et al.

(10) Patent No.: US 6,559,473 B1
(45) Date of Patent: *May 6, 2003

(54) LIGHT-EMITTING DIODES WITH HETERO-PN-JUNCTION

(75) Inventors: Nu Yu, Kawagoe (JP); Wen-Bing Kang, Kawagoe (JP); Akihiko Tokida, Kawagoe (JP)

(73) Assignee: Hoechst Japan Limited, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/765,681
(22) PCT Filed: Aug. 3, 1995
(86) PCT No.: PCT/JP95/01539
§ 371 (c)(1), (2), (4) Date: Jun. 16, 1997
(87) PCT Pub. No.: WO96/04687
PCT Pub. Date: Feb. 15, 1996

(30) Foreign Application Priority Data

Aug. 5, 1994 (JP) .............................................. 6-184943

(51) Int. Cl.$^7$ .......................... H01L 35/24; H01L 33/00
(52) U.S. Cl. .............................. 257/40; 257/90; 257/94; 257/96; 438/46; 438/47; 313/502; 313/503; 313/504
(58) Field of Search .............................. 257/40, 90, 94, 257/96, 97, 103; 438/46, 47; 313/502, 503, 504

(56) References Cited

U.S. PATENT DOCUMENTS

| | | | |
|---|---|---|---|
| 5,093,698 A | * | 3/1992 | Egusa ......................... 257/40 |
| 5,350,459 A | * | 9/1994 | Suzuki et al. ................. 257/40 |

FOREIGN PATENT DOCUMENTS

| | | | |
|---|---|---|---|
| JP | 62-222670 | * 9/1987 | .................. 257/40 |
| JP | 3-230584 | * 10/1991 | |
| JP | 5-166583 | * 7/1993 | |

OTHER PUBLICATIONS

Wu et al. ("poly(p–phenylene vinylene)/quinoline aluminum heterostructure light emitting diode" Appl. Phys. lett. 66 (6), pp 653–655, Feb. 6, 1995).*

* cited by examiner

*Primary Examiner*—Steven Loke
*Assistant Examiner*—Donghee Kang
(74) *Attorney, Agent, or Firm*—Frommer Lawrence & Haug LLP

(57) ABSTRACT

An organic light-emitting diode with high luminance and high efficiency comprising an anode, an organic pn-junction and a cathode layered sequentially in this order, wherein the organic pn-junction emits light by an electric current passing through the diode in an electric field applied between the anode and the cathode, characterized in that the organic pn-junction is composed of an organic p-type luminescent-semiconductor thin film and an organic n-type luminescent-semiconductor thin film, wherein one surface of the organic p-type luminescent-semiconductor thin film is in contact with the anode and another surface of the organic p-type luminescent-semiconductor thin film is in contact with the organic n-type luminescent-semiconductor thin film, and one surface of the organic n-type luminescent-semiconductor thin film is in contact with the cathode and another surface of the organic n-type luminescent-semiconductor thin film is in contact with the organic p-type luminescent-semiconductor thin film and wherein the diode satisfies all the conditions of the following equations 1 to 3:

$X1 \leq X2$  Equation 1:

$IP1 \leq IP2$  Equation 2:

$-0.2 \text{ eV} \leq (IP2-IP1)-(X2-X1) \leq 0.2 \text{ eV}$  Equation 3:

in which X1 denotes an absolute value of the electron affinity of the organic p-type luminescent-semiconductor, X2 denotes an absolute value of the electron affinity of the organic n-luminescent-semiconductor, IP1 denotes an ionization potential of the organic p-type luminescent-semiconductor and IP2 denotes an ionization potential of the organic n-type luminescent-semiconductor.

15 Claims, 10 Drawing Sheets

LIGHT-EMITTING DIODES WITH HETERO-PN-JUNCTION

TECHNICAL FIELD

This invention relates to a light-emitting device provided with a light-emitting layer structure by utilizing electroluminescence of a light-emitting material which emits light by passing an electric current therethrough under an applied electric field and which is formed in a layered structure, and, in particular, it relates to an organic light-emitting diode in which the light-emitting layer structure is constructed from a hetero-PN-junction comprising an organic semiconductor as a light-emitting zone.

BACKGROUND ART

An electroluminescent device (hereinafter, abbreviated to "EL device") is a device which emits light by applying an electric field to a substance, especially a semiconductor. Light-emitting diodes are a well-known example of EL devices made from inorganic compound semiconductors of an element (elements) of: Groups III to V of the Periodic Table such as GaAs or GaP. These devices emit light effectively at a long wavelength side of a visible light region and are widely utilized for daily electronic appliances, but they have their limit in size and therefore the easy and economical utilization thereof in a large-area display has not yet been realized. As an alternative structure capable of being produced over a large area, thin film type EL devices are well-known which are produced from an inorganic material by doping semiconductors of compounds derived from an element or elements of the Groups II to IV of the Periodic Table such as ZnS, CaS and SrS with Mn or a rare earth metal, for example, Eu, Ce, Tb or Sm as a light-emitting center. However, for driving the EL devices using these inorganic semiconductors, an alternating current electricity and a high voltage are required and thus such EL devices are expensive, and further a full-color device is difficult to obtain.

In order to solve the above problems, EL devices using an organic thin film is extensively studied. For example, such EL devices include those using a vapor deposition film of an organic luminescent (fluorescent) dye reported in the following literature references:
(1) S. Hayashi et al., J. Appl. Phys. 25, L773 (1986)
(2) C. W. Tang et al., Appl. Phys. Lett., 51, 913 (1987)

To date, organic EL devices which emit light of from blue to red colors have been developed. Details of the organic electroluminescence are described in, for example, the following literature references:
(1) "Organic EL Device Development Strategy", compiled by Next Generation Display Device Research Association, Science Forum (published 1992)
(2) "Electroluminescent Materials, Devices, and Large-Screen Displays", SPIE Proceedings Vol. 1910 (1993), E. M. Conwell and M. R. Miller Further, in recent years, a thin film is easily formed by a spin-coating, and an EL device using a thermally stable poly (arylene vinylene) polymer has been studied. Such EL devices using the poly (arylene vinylene) polymer are described in, for example, the following literature references:
(1) J. H. Burroughes, Nature, 347, 539 (1990)
(2) D. Braun, Appl. Phys. Lett., 58, 1982 (1991)

These organic EL devices emit a light, upon injection of an electric current, by recombination of the electron and the injected hole in the process of a radiative decay of the produced excitons. All organic EL devices known to date are based on the following three kinds of typical two- or multi-layer device structures, that is, 1) as shown in FIG. 1, an organic EL device having a two-layer structure comprising an organic light-emitting layer 2 and a hole transport layer 3 sandwiched in between a metal cathode 1 and a transparent anode 4 on a transparent substrate 5, which device emits light when the hole from the hole transport layer is injected into the light-emitting layer where the hole is combined with the electron; 2) as shown in FIG. 1, an organic EL device having a two-layer structure comprising an electron transport layer and an organic light-emitting layer, which device emits light when the electron from the electron transport layer is injected into the light-emitting layer where the hole is combined with the electron; and 3) as shown in FIG. 2, an organic EL device having a three-layer structure comprising an electron transport layer 6, an organic light-emitting layer 2 and a hole transport layer 3, sandwiched in between an metal cathode 1 and a transparent anode 4 on a transparent substrate 5, which device emits light when both the electron from the electron transport layer and the hole from the hole transport layer are injected into the light-emitting layer where the hole is combined with the electron.

DISCLOSURE OF THE INVENTION

However, in the conventional organic EL devices in which two- or multi-layer organic thin films are used, only one layer emits light while the other layers concerned with electron or hole transport. In addition, the conventional organic EL devices still have unsolved technical problems in luminous efficiency and device lifetime. As a result of extensive studies in order to develop an EL device having unique and excellent characteristics, the present inventors found that an organic pn-junction can be appropriately prepared by consideration of ionization potential, electron energy bandgap, Fermi level and mobility of an p-type organic luminescent-semiconductor material and an n-type organic luminescent-semiconductor material as well as thickness of these organic thin films, and that an organic light-emitting diode using the organic pn-junction can be obtained, and completed the present invention based on the above discovery.

An object of the present invention is therefore to provide an organic light-emitting diode having high luminance and high luminous efficiency.

The thin film of the organic compounds is a certain type of semiconductors, and, in an organic EL device composed of a layered organic thin films, electric properties on a contacting boundary surface thereof determine the properties of the organic EL device per se. For this reason, the relationship between each level of ionization potential, electron energy bandgap, Fermi level and mobility of the organic thin layers on contacting boundary surfaces, and the work functions of an anode and a cathode is very important. With consideration of the above relationship, the present invention finally reached an organic EL device having high luminous efficiency by using a semiconductor model.

The organic pn-junction is constructed by laminating two adjacent thin organic luminescent-semiconductor films which are different in the bandgap. At the time of thermal equilibrium, the total Fermi level in the two materials is constant. The thermal equilibrium is achieved by diffusion of a free electron carrier through a junction surface, and, as a result, an internal electric field is generated at the junction.

Due to this internal electric field, shift of vacuum level and bending of band edge are generated. The internal electric field generated in conduction bands of a p-type semiconductor material and an n-type semiconductor material functions as a voltage barrier which prevents transfer of electrons escaping from the n-type material portion to the p-type material portion. Also, in a similar manner, the internal electric field generated in valence electron band functions as a voltage barrier which prevents transfer of holes from the p-type material portion to the n-type material portion. When forward bias is applied, electrons are injected into the n-type material from the cathode and holes are injected into the p-type material from the anode. Thus, the injected electrons and holes are accumulated on the boundary surface of pn-junction. When a bias voltage exceeds a certain level, the electron enters a p-type zone of the pn-junction over the voltage barrier and is recombined with the hole thereby producing molecular excitons.

A singlet molecular exciton emits luminescence thereby emitting light having a central wavelength determined by the electron energy bandgap of a p-type luminescent material. Also, when a bias voltage exceeds another level, the hole enters an n-type material portion over the voltage barrier and is recombined with the electron thereby producing molecular excitons similarly. A singlet molecular exciton emits luminescence thereby emitting light having a central wavelength determined by the electron energy bandgap of an n-type luminescent-material. On the other hand, when a luminescent material having a small bandgap is excited by the light emitted by a luminescent material having a large bandgap, photoluminescence is generated. All of these emissions are accumulated to form light emitted by the pn-junction. The emission spectrum distribution of the light is obtained by convolution treatment of the spectrum from each emission portion. The ratio of these emission portions is determined by the injection balance of holes and electrons at the pn-junction.

Each of the organic p-type luminescent-semiconductor and the organic n-type luminescent-semiconductor used preferably has bandgap energies ranging from 1 eV to 3.5 eV.

In the present invention, as a result of studies on each of absolute values of the ionization potentials IP1 and IP2 of the organic p-type luminescent material and the organic n-type luminescent material as well as on each of absolute values of the electron affinity X1 and X2 thereof, it was found that, in the pn-junction fabricated by using the organic p-type luminescent material and the organic n-type luminescent material satisfying the relationship of the following equations 1 to 3, electrons and holes are recombined at the same time in both the p-type material zone and the n-type material zone when forward bias is applied, and thus light is emitted from both the p-type luminescent material and the n-type luminescent material:

$$X1 \leq X2 \qquad \text{Equation 1:}$$

$$IP1 \leq IP2 \qquad \text{Equation 2:}$$

$$-0.2\text{eV} \leq (IP2-IP1)-(X2-X1) \leq 0.2 \text{ eV} \qquad \text{Equation 3:}$$

wherein X1 denotes an absolute value of the electron affinity of the organic p-type luminescent-semiconductor, X2 denotes an absolute value of the electron affinity of the organic n-type luminescent-semiconductor, IP1 denotes an ionization potential of the organic p-type luminescent-semiconductor and IP2 denotes an ionization potential of the organic n-type luminescent-semiconductor.

As described above, when the relative difference in the bandgap energy between the adjacent materials becomes narrow, the organic hetero-pn-junction has a high injection efficiently of electrons and holes and, as a result, the resistance of charge injection through a boundary surface of the junction becomes low whereby the voltage applied can be lowered. Therefore, high light-emission efficiency can be obtained by a low drive voltage. Furthermore, due to decreased resistance on a boundary surface of the junction, Joule's heat generated during the drive of EL device decreases. As a result, deterioration of the device by heating can be prevented thus to lengthen the life of the device. When the relative difference in the bandgap energy between the adjacent materials is 0, namely, if both of the p-type luminescent-semiconductor and the n-type luminescent-semiconductor are made of the same organic luminescent material having the same bandgap energy, the organic pn-junction is an organic homo-pn-junction. Higher efficiency can be expected from the organic EL device. The present invention was completed by the above-described discovery.

BEST MODE FOR CARRYING OUT THE INVENTION

Figure 1:
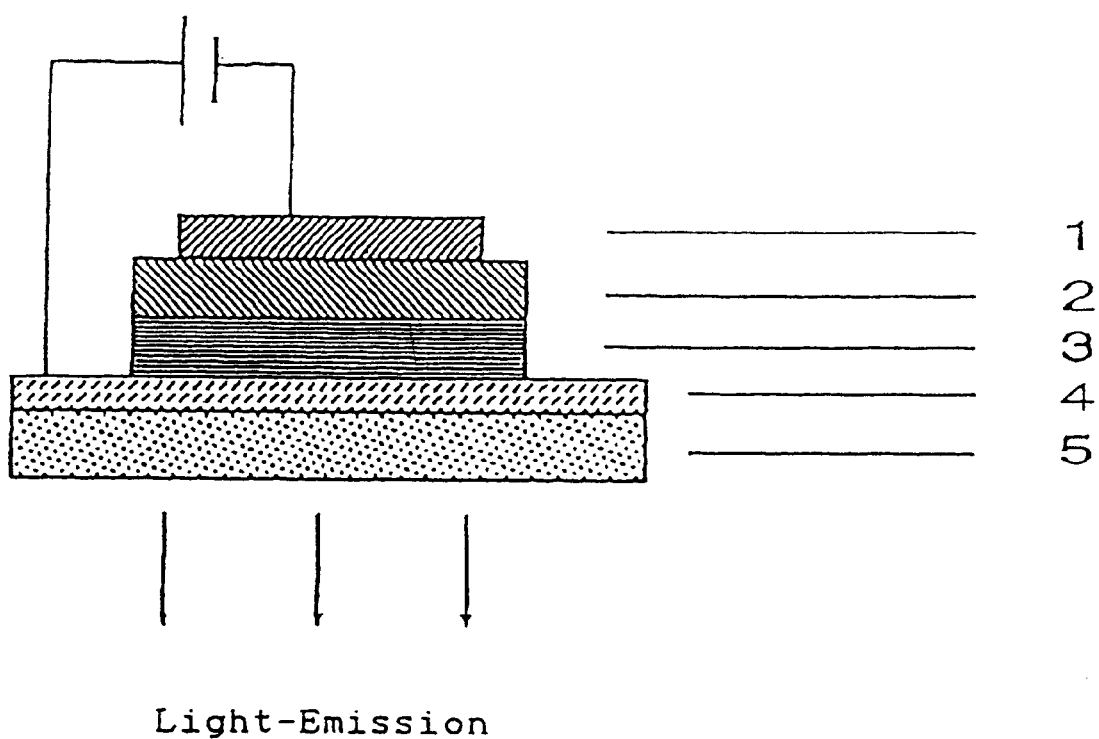
FIG. 1 is a cross-sectional drawing showing an example of an organic EL device having a layered structure containing a light-emitting layer between a metal cathode and a transparent anode on a transparent substrate.
Figure 2:
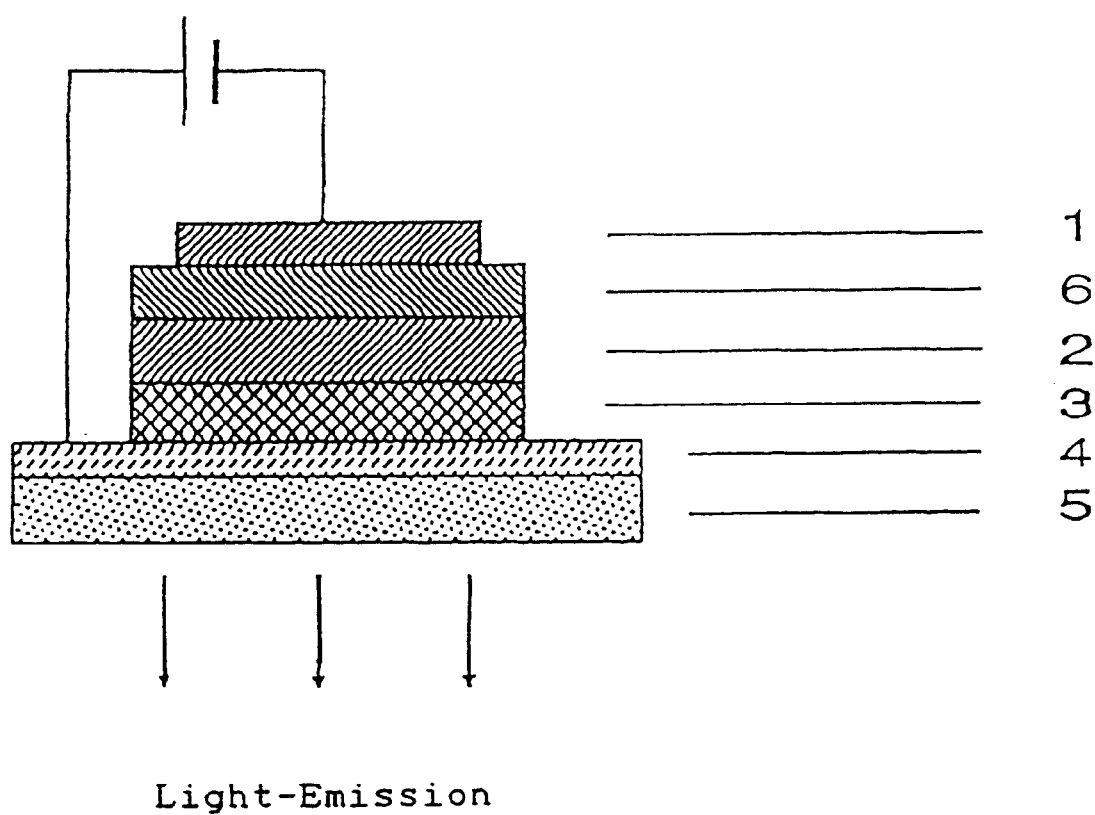
FIG. 2 is a cross-sectional drawing showing another example of an organic EL device having a layered structure containing a light-emitting layer between a metal cathode and a transparent anode on a transparent substrate.

The present invention is hereinafter described in detail.

Materials used for the anode in the organic light-emitting diode of the present invention are preferably those having a high work function, and such materials include nickel, gold, platinum, palladium, selenium, iridium or an alloy of any combination thereof, tin oxide, ITO or copper iodide. Also, an electroconductive polymer such as poly (3-methylthiophene), polyphenylene sulfide or polyaniline.

These materials can be used independently or by layering two or more materials such as by film coating polyaniline on ITO.

On the other hand, materials used for the cathode are preferably those having a low work function, and such materials include silver, lead, tin, magnesium, aluminum, calcium, indium, chromium, lithium or an alloy of any combination thereof.

Also, of the materials used as the anode and cathode, at least one of them is preferably transmit 50% or more of light in a wavelength region of the emitted light of the device.

The organic p-type luminescent-semiconductor material used in the present invention can be any materials which satisfy the relationship to the ionization potential and the electron affinity of the organic n-type luminescent material shown by the above equations 1 to 3, and luminous dyes, luminous dyes dispersed in polymer materials, or luminous polymer materials can be used. Examples of organic p-type luminescent materials used in the present invention are shown below.

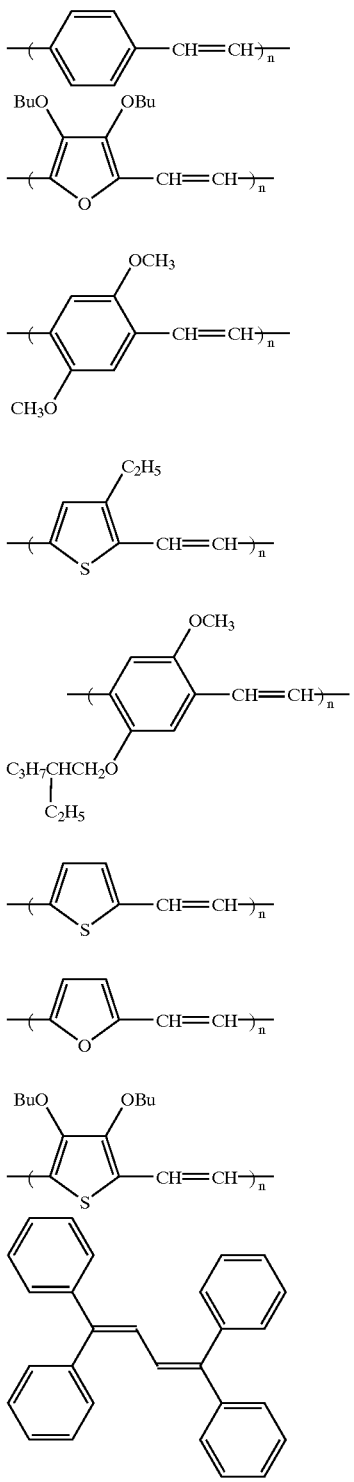

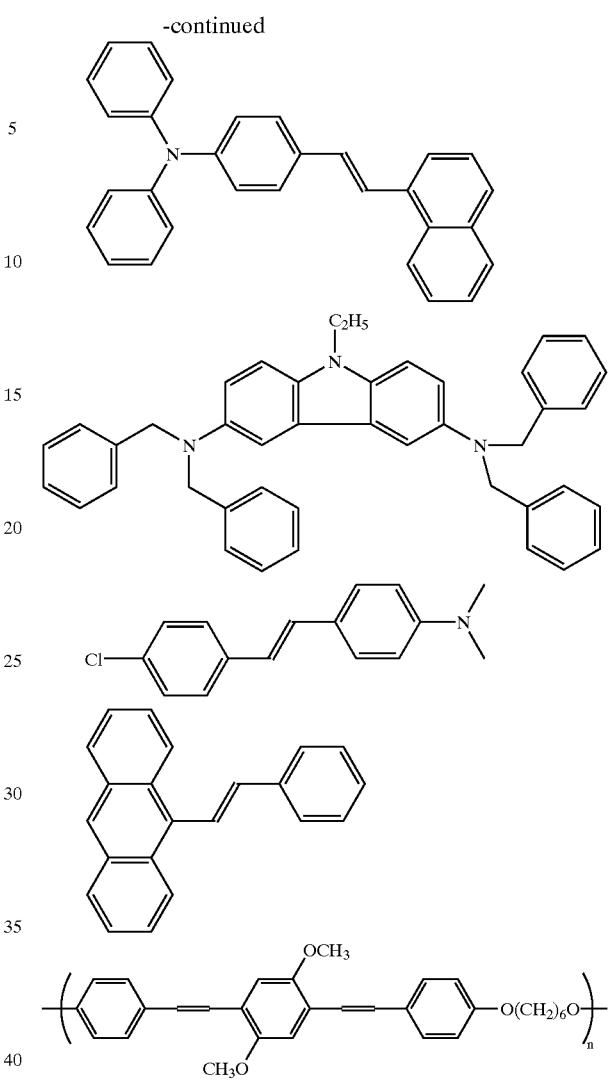

Compound of Example 3
wherein n is an integer of 2 or more.

Of these p-type luminescent materials, a poly (arylene vinylene) polymer represented by the following formula (I) which can be easily fabricated into a thin film by, for example, a spin coating method, and which is thermally stable is preferred.

(I)

wherein Ar represents a substituted or unsubstituted divalent aromatic hydrocarbon group or a substituted or unsubstituted divalent heterocyclic group, and the aromatic hydrocarbon group and the heterocyclic group may be a fused ring, and n is an integer of 2 or more. n is not particularly limited as long as it is an integer of 2 or more, but in Formula (I) n is preferably from 5 to 30,000 and more preferably from 10 to 10,000.

Preparation of an organic p-type poly (phenylene vinylene) luminescent thin film using poly (phenylene vinylene) (PPV) is described below.

Preferably 40~160 mg/ml, more preferably 70~90 mg/ml of a PPV precurser solution was spin-coated on a well-rinsed ITO substrate under the condition of preferably 1000~3000 rpm, more preferably 1800~2200 rpm for preferably 30~200 seconds, more preferably 80~120 seconds. Then the spin-coated ITO was subjected to a heat treatment in a vacuum of $10^{-4} \sim 10^{-6}$ torr at a temperature of preferably 200~350° C., more preferably 260~300° C. for preferably 0.5~10 hours, more preferably 2~6 hours to form a thin film of poly (phenylene vinylene). Thus an organic p-type poly (phenylene vinylene) luminescent thin film is prepared. A thin film having high luminance and high efficiency is obtained under such preparation conditions.

Also, the organic n-type luminescent-semiconductor material used in the present invention can be any materials which satisfy the relationship to the ionization potential and the electron affinity of the organic p-type luminescent material defined by the above equations 1 to 3, and luminous dyes, luminous dyes dispersed in polymer materials, or luminous polymer materials can be used. Examples of organic n-type luminescent materials used in the present invention are shown below.

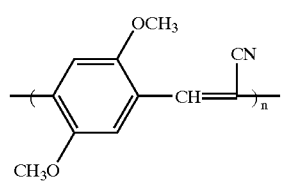
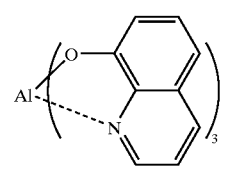
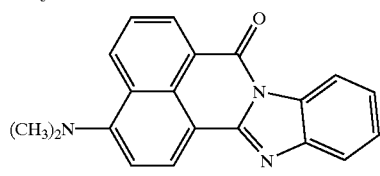
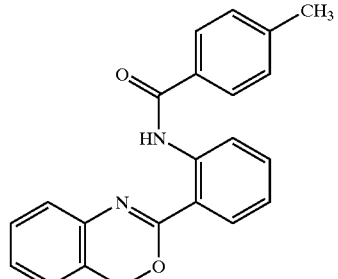
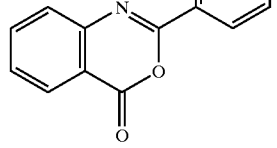
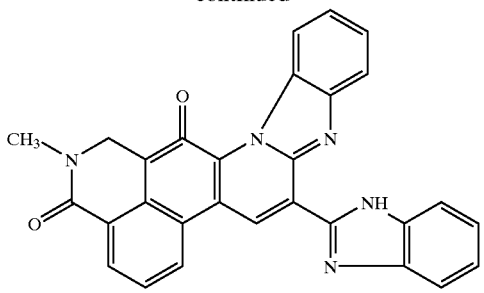
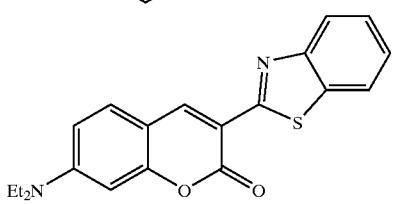
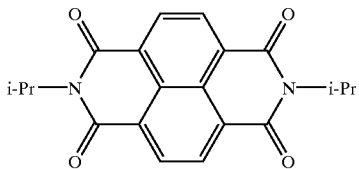
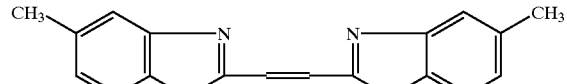
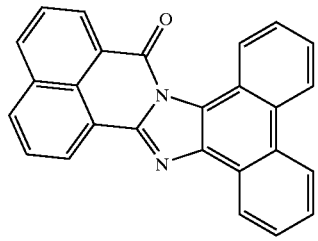
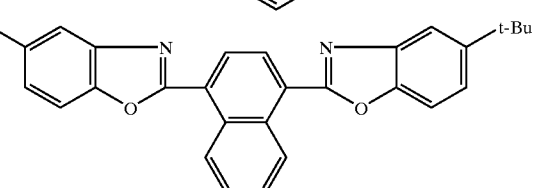
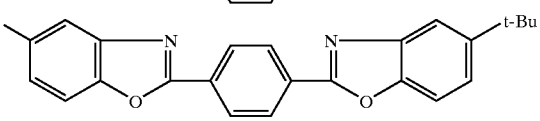

wherein n is an integer of 2 or more.

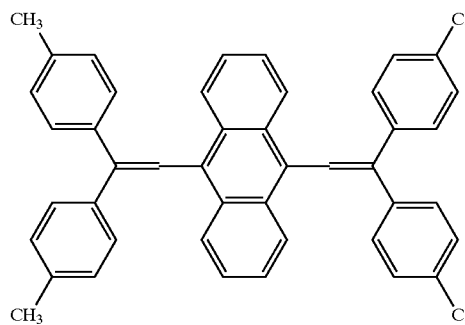
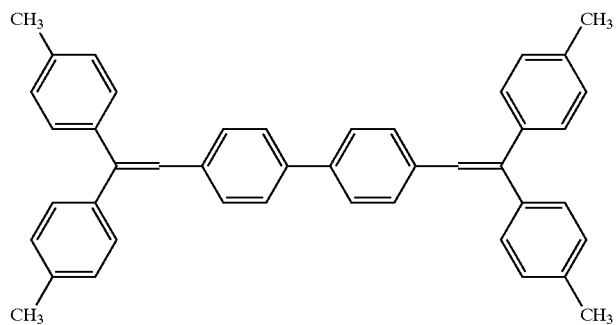

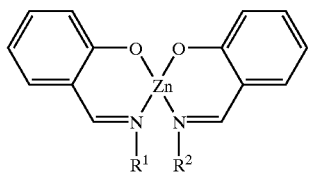
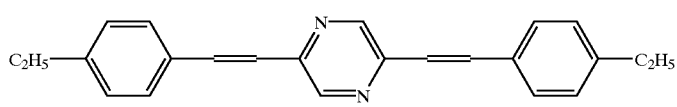
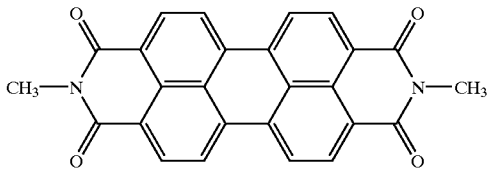
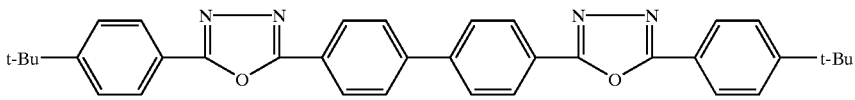

The anode, the cathode and the thin films of the organic p-type and n-type luminescent-semiconductor which form the organic pn-junction used in the organic light-emitting diode of the present invention can be formed by a conventional known methods for example, vacuum deposition, spin coating, sputtering or gel-sol method. The thickness of each of the organic luminescent-semiconductors is preferably 500 nm or less and more preferably from 10 nm to 200 nm. Accordingly, the thickness of the organic pn-junction can be 1,000 nm or less, preferably from 1 nm to 500 nm and more preferably 20 to 400 nm.

Also, the above-described organic light-emitting diode can be prepared on a support. The material of the support is not particularly limited, but a material generally used as supports of organic EL devices such as glass, quartz, plastics or metal sheets can be used.

Figure 3:
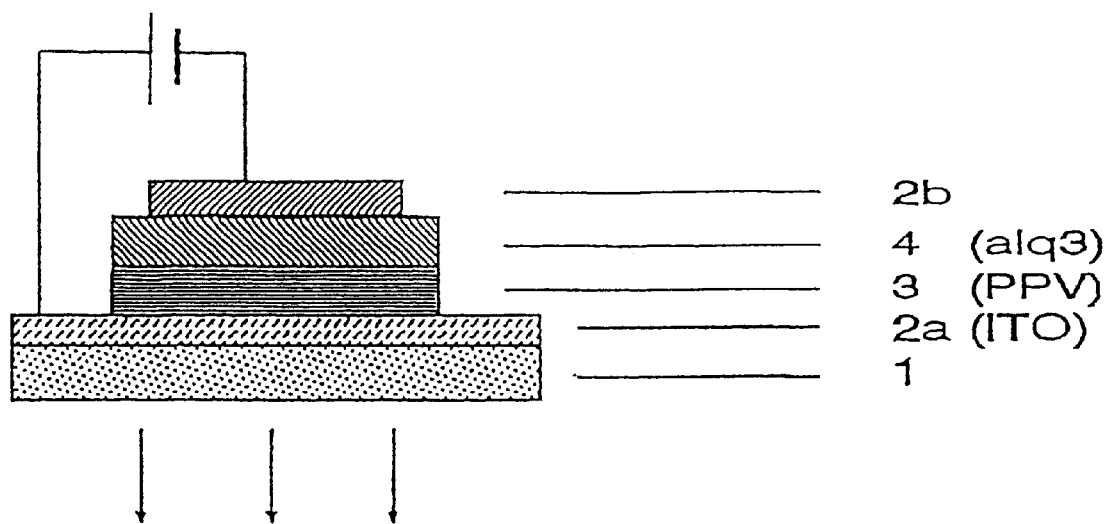
FIG. 3 is a cross-sectional drawing of an organic light-emitting diode showing an example of the present invention.

An example of the present invention is an organic light-emitting diode as shown in FIG. 3. In figure, an ITO film formed on a transparent glass substrate is used as anode 2a. The resistance of such an ITO electrode is preferably several 100Ω/□ or less. In FIG., 2b is a cathode, and a material having a low work function, for example, silver, lead, tin, magnesium, aluminum, calcium, indium, chromium, lithium or an alloy of any combination thereof is used as a cathode. In this embodiment, aluminum or an alloy of magnesium and aluminum is used. The organic hetero-pn-junction sandwiched in between anode 2a and cathode 2b is constructed from a layered material composed of thin film 3 of p-type organic luminescent material and thin film 4 of n-type organic luminescent material.

The thin film 3 of the p-type organic luminescent material used herein is preferably a poly (arylene vinylene) polymer which is well-known as a luminescent polymer material.

The poly (arylene vinylene) polymer used in the present invention can be synthesized by the known method. For example, the methods described in the following references can be used:
(1) R. A. Wessling and R. G. Zimmerman, U.S. Pat. No. 3,706,677
(2) I. Murase et al, Synth. Met., 17, 639 (1987)
(3) S. Antoun et al, J. Polym. Sci., Polym. Lett. Ed., 24, 504 (1986)
(4) I. Murase, et al, Polym. Comun., 1205 (1989)
(5) Japanese Laid-open Patnet Publication No. Hei-1-79217 (JP-A2-01079217)
(6) Japanese Laid-open Patent Publication No. Hei-1-254734 (JP-A2-01254734)

The poly (arylene vinylene) polymer used in the present invention is grouped into the polymer which is soluble in solvents and the polymer which is insoluble in solvents. The polymer soluble in solvents is dissolved, after synthesis and purification thereof, in an organic solvent in which the polymer dissolves, and the resulting solution is coated by, for example, a spin coating method, to form a thin film on a substrate. In the case of the polymer insoluble in solvents, a solution of a corresponding intermediate polymer which is soluble in solvents is used for forming a thin film by, for example, a spin coating method, and then the film is converted into a conjugated polymer by heat cleavage under vacuum.

As an example of poly (arylene vinylene) polymer used in the present invention, a poly (phenylene vinylene) polymer (hereinafter abbreviated as PPV) shown below was used.

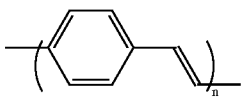

wherein n is an integer of 2 or more. Such PPV can be prepared by, for example, the Wessling synthesis method shown below, in which a bissulfonium salt produced by reacting 1,4-bischloromethylbenzene and tetrahydrothiophene is reacted with an alkali in a mixed solvent system of water and methanol to obtain an intermediate polymer which is soluble in methanol. A methanolic solution of the resulting intermediate polymer is spin-coated on a transparent ITO glass substrate to form a film, and then the substrate having coated with the intermediate polymer is heated (usually at 250° C. or more) for several hours in vacuum to obtain a Elm of unsubstituted poly (phenyl vinylene) on the substrate.

Wessling Synthesis Method

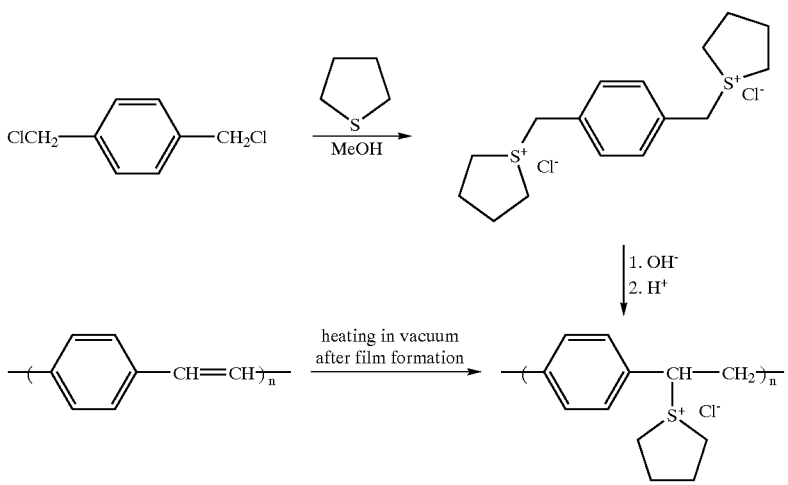

wherein n is an integer of 2 or more.

In FIG. 3, 4 is a thin film of an organic n-type luminescent-semiconductor material, and a material having an ionization potential and an electron affinity satisfying each of the equations 1 to 3 in relation to the poly (arylene vinylene) polymer film which is the above-described p-type organic luminescent-semiconductor material is used, and, when the p-type material is PPV, tris (8-quinolinol) aluminum (hereinafter abbreviated as "Alq3") shown below in formula (II) is preferably used as the organic n-type luminescent-semiconductor material. Such a luminous dye thin film can be prepared by a known film-forming method such as vacuum deposition.

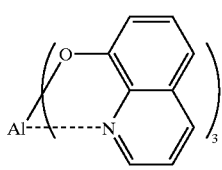

(II)

Examples of the present invention are illustrated hereinafter.

EXAMPLE 1

Preparation of Organic pn-Junction Light-Emitting Diode Using Poly (Phenylene Vinylene) and Alq3

Eighty (80) of the intermediate polymer synthesized by the Wessling synthesis method shown above having formula (III):

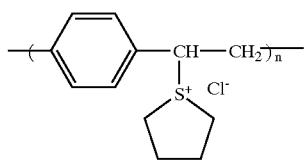

Figure 4A:
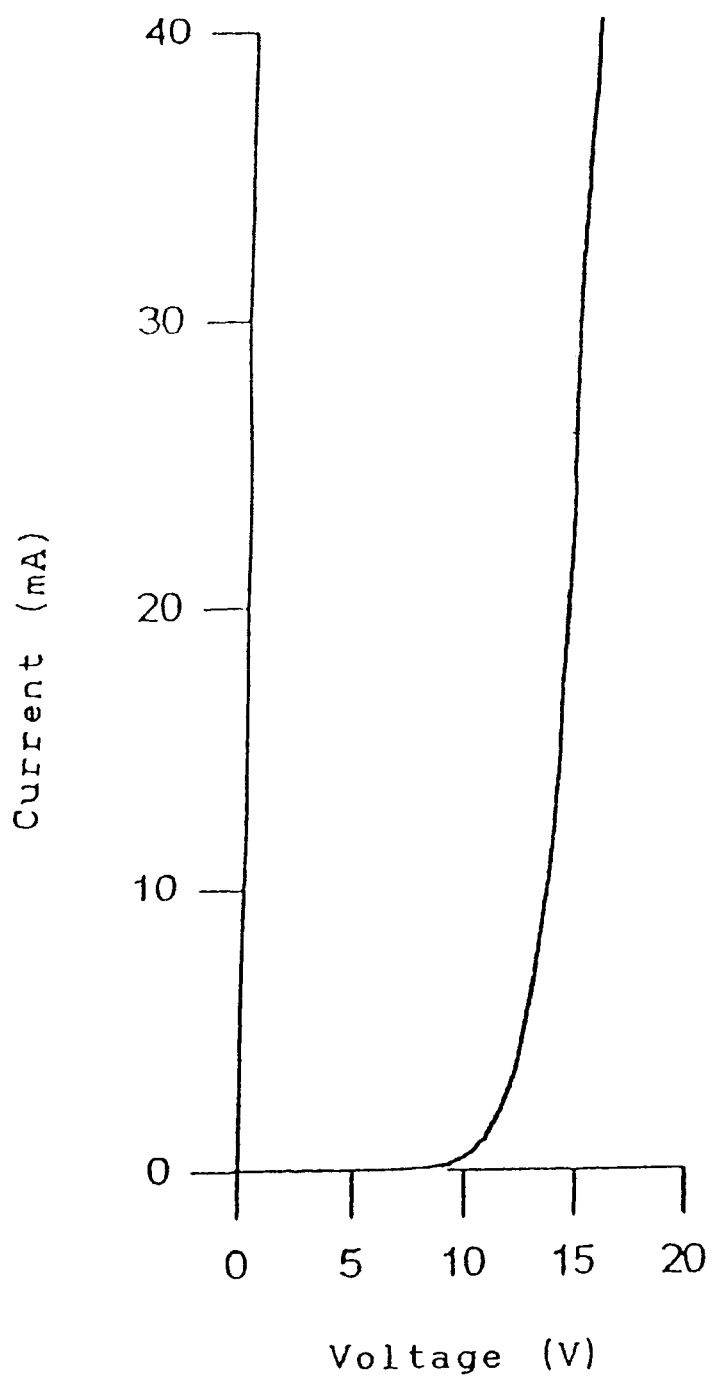
FIG. 4 is graphs showing an electric current-voltage curve, a luminance-electric current curve, and an electroluminescence spectrum (hereinafter, referred to as "EL spectrum") with regard to the device obtained in Example 1.
Figure 4B:
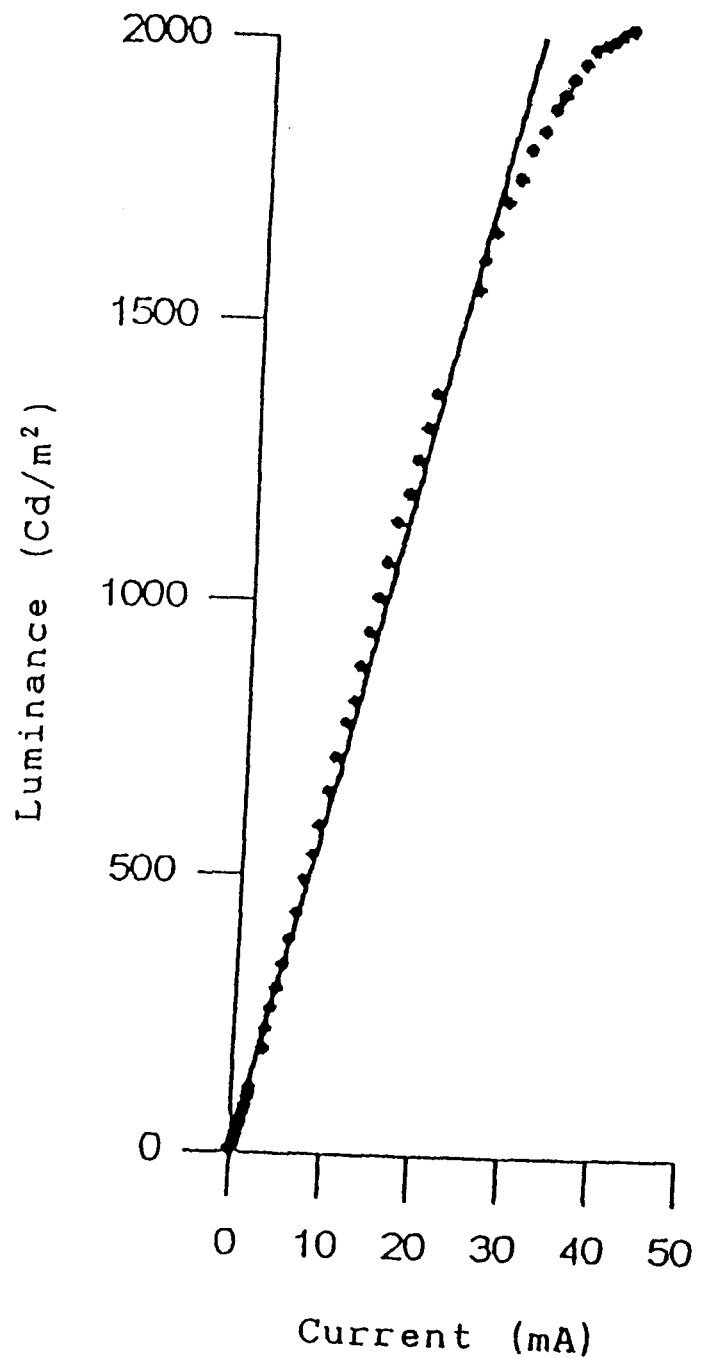
Figure 4C:
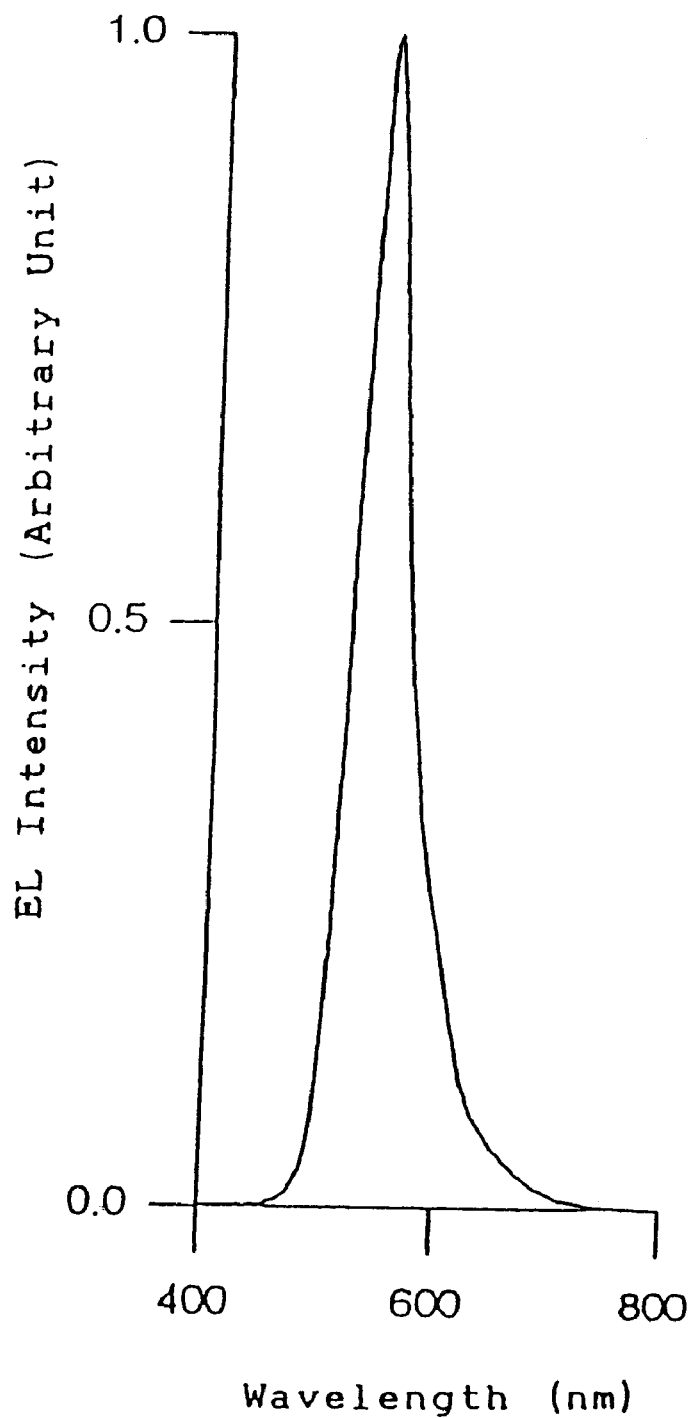

(III)

wherein n is an integer of 2 or more, was dissolved in 10 ml of methanol and spin coated on a well-rinsed glass substrate (25 mm×75 mm, thickness of 1.1 mm) under the condition of 2,000 rpm for 100 seconds, followed by subjecting a heating treatment in a vacuum of $10^{-5}$ torr, at 280° C. for 4 hours to form a thin film of poly (phenylene vinylene) (PPV) having a film thickness of 30 nm on ITO. Subsequently, Alq3 was vapor deposited in a vacuum of $4–8\times10^{-6}$ torr by the resistance heating method at a rate of 3 to 7 Å/sec in a thickness of 40 nm. Further, an alloy of magnesium (3%) and aluminum (97%) was vapor deposited on the Alq3 thin film in a vacuum of $10^{-6}$ torr by resistance heating at a rate of 5 Å/sec through a mask of 2 mm×2 mm to obtain an Mg—Al alloy electrode with the size of 2 mm×2 mm and the thickness of 150 nm whereby a light-emitting diode was fabricated. A positive DC voltage was applied to the side of the ITO glass substrate, while a negative voltage was applied to the side of the metal electrode, followed by observation of light-emission of the diode from the surface of the ITO glass substrate using a color brightness meter (Model BM-7 of Topcon Corporation). The electric field with a DC voltage of 8 V and a current density of 23 mA/cm$^2$ was applied between the electrodes of the device, with the result that an emission of green-yellow light with the brightness of 100 Cd/M$^2$ in which light the CIE 1931 color coordinates were x=0.38 and y=0.57 was obtained. The luminous efficiency was 0.17 lm/W. The maximum emission wavelength was 545 nm and the maximum brightness was 2000 Cd/m$^2$. The electric current-voltage curve, luminance-electric current curve and EL spectrum of this device are shown in FIG. 4. The EL spectrum of the device is also shown in 5a of FIG. 5 in comparison with those of other diodes, which comparison is mentioned below. It was confirmed that as a result of comparing the EL spectrum of this diode with the undermentioned single EL spectra of Alq3 and PPV, both of the PPV and Alq3 layers of the diode of the present invention emitted. The ionization potential of the Alq3 deposited film was measured by an instrument (Model AC-1 of Riken Keiki Co., Ltd.) and found to be 5.7 eV. By finding the remainder between the above ionization potential and the bandgap value of the Alq3 deposited film calculated as 2.7 eV based on the absorption edge thereof, the electron affinity of Alq3 was calculated as 3.0 eV. With respect to the PPV deposited film, the same measurement and calculations were carried out. The ionization potential, bandgap value and electron affinity were 5.1 eV, 2.5 eV and 2.6 eV, respectively.

EXAMPLE 2
Preparation of Organic pn-Junction Light-Emitting Diode Using Poly (Phenylene Vinylene) and Alq3

Figure 6A:
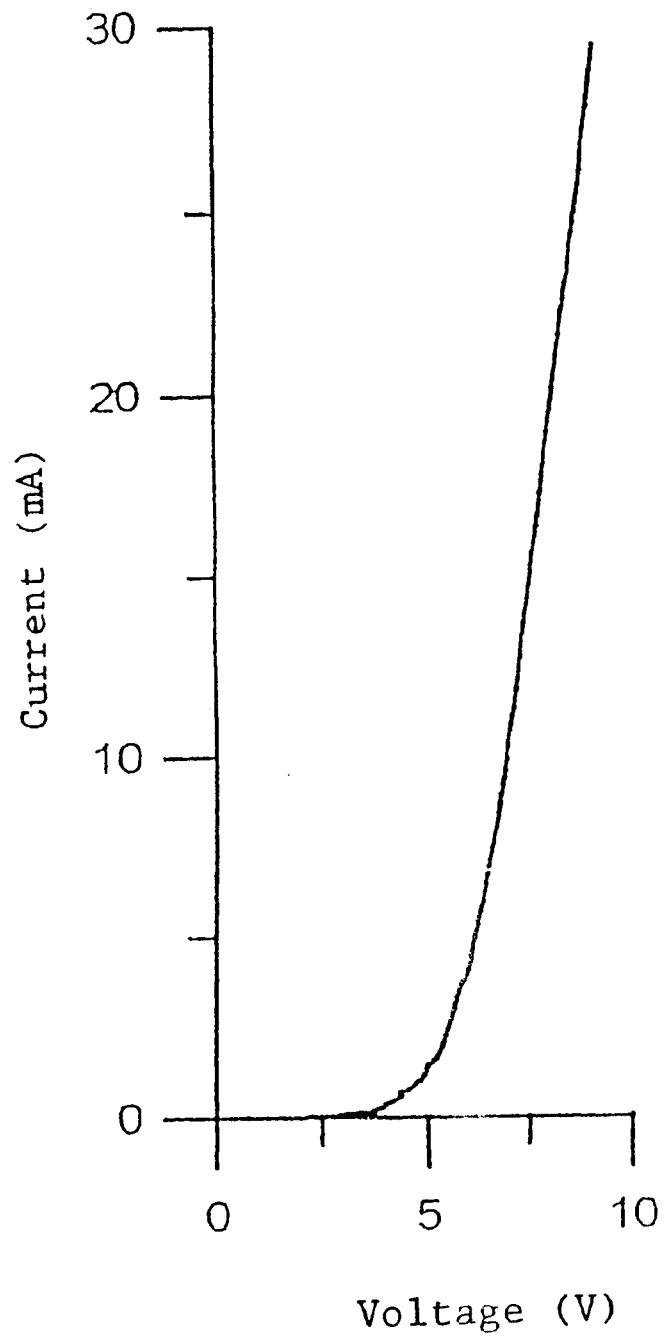
FIG. 6 is graphs showing an electric current-voltage curve, a luminance-electric current curve, and an EL spectrum with respect to the device obtained in Example 2.
Figure 6B:
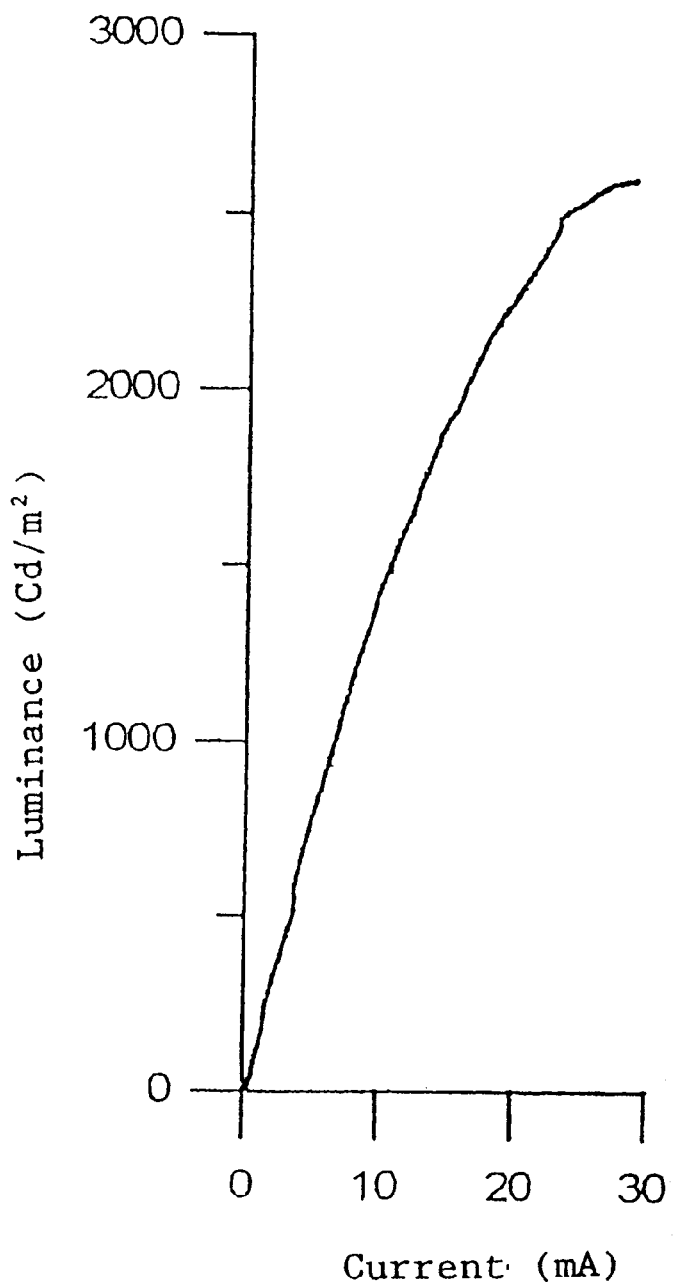
Figure 6C:
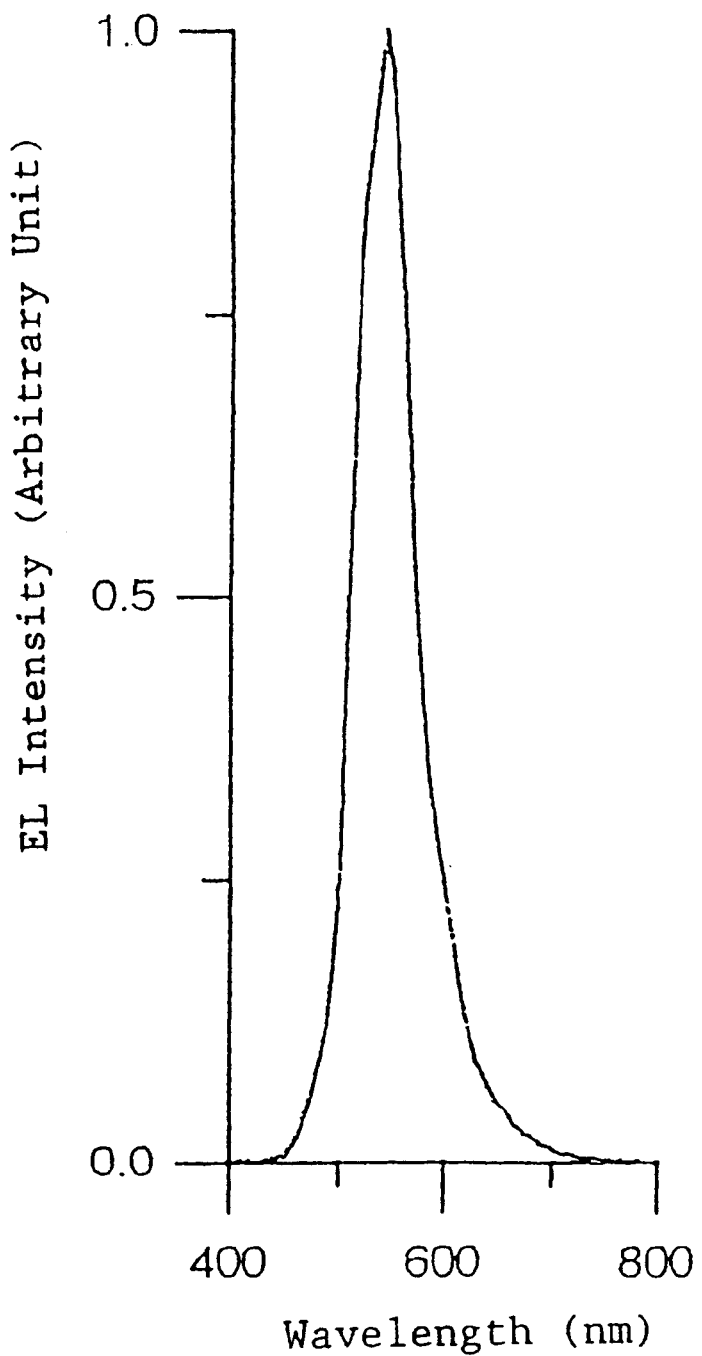

Eighty (80) of the intermediate polymer synthesized by the Wessling synthesis method shown above having formula (III):

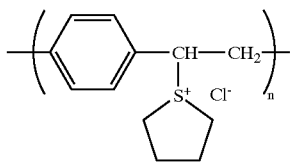

wherein n is an integer of 2 or more, was dissolved in 10 ml of methanol and spin coated on a well-rinsed glass substrate (25 mm×75 mm, thickness of 1.1 mm) under the condition of 2,000 rpm for 100 seconds, followed by subjecting a heating treatment in a vacuum of $10^{-5}$ torr, at 280° C. for 4 hours to form a thin film of poly (phenylene vinylene) (PPV) having a film thickness of 45 nm on ITO. Subsequently, Alq3 was vapor deposited in a vacuum of $4-8×10^{-6}$ torr by the resistance heating method at a rate of 3 to 7 Å/sec in a thickness of 30 nm. Further, an alloy of magnesium (3%) and aluminum (97%) was vapor deposited on the Alq3 thin film in a vacuum of $10^{-6}$ torr by resistance heating at a rate of 5 Å/sec through a mask of 2 mm×2 mm to obtain an Mg—Al alloy electrode with the size of 2 mm×2 mm and the thickness of 150 nm whereby a light-emitting diode was fabricated. A positive DC voltage was applied to the side of the ITO glass substrate, while a negative voltage was applied to the side of the metal electrode, followed by observation of light-emission of the diode from the surface of the ITO glass substrate using a color brightness meter (Model BM-7 of Topcon Corporation). The electric field with a DC voltage of 5 V and a current density of 40 mA/cm² was applied between the electrodes of the device, with the result that an emission of green-yellow light with the brightness of 238 Cd/m² in which light the CIE 1931 color coordinates were x=0.38 and y=0.59 was obtained. The luminous efficiency was 0.37 lm/W. The maximum emission wavelength was 545 nm and the maximum brightness was 2600 Cd/m². The electric current-voltage curve, luminance-electric current curve and EL spectrum of this device are shown in FIG. 6. It was confirmed that as a result of comparing the EL spectrum of this diode with the undermentioned single EL spectra of Alq3 and PPV, both of the PPV and Alq3 layers of the diode of the present invention emitted. The ionization potential of the Alq3 deposited film was measured by an instrument (Model AC-1 of Riken Keiki Co., Ltd.) and found to be 5.7 eV. By finding the remainder between the above ionization potential and the bandgap value of the Alq3 deposited film calculated as 2.7 eV based on the absorption edge thereof, the electron affinity of Alq3 was calculated as 3.0 eV. With respect to the PPV deposited film, the same measurement and calculations were carried out. The ionization potential, bandgap value and electron affinity were 5.1 eV, 2.5 eV and 2.6 eV, respectively.

EXAMPLE 3

Preparation of Organic pn-Junction Light-Emitting Diode Using Spirobifluorene Compound and Alq3

The organic p-type luminescent spirobifluorene compound having formula (IV):

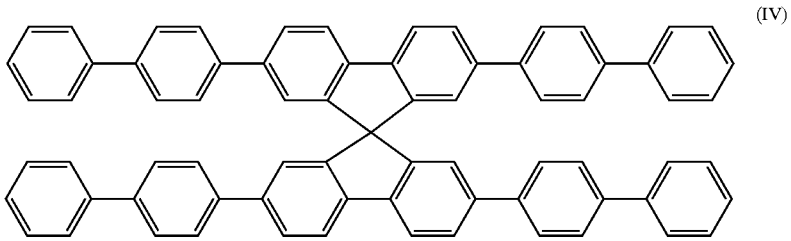

was vapor deposited on a well-rinsed glass substrate (25 mm×75 mm×1.1 mm) to which ITO having a thickness of 100 nm to be used as a transparent electrode is attached, in a vacuum of $10^{-6}$ torr by the resistance heating at a vacuum deposition rate of 3 to 7 Å/sec. Then, as described above in Examples 1 and 2, Alq3, an organic n-type luminescent material, was vapor deposited on the thin spiro-film having a thickness of 10 nm. Further, an alloy of magnesium (3%) and aluminum (97%) was vapor deposited on the Alq3 thin film in a vacuum of $10^{-6}$ torr by the resistance heating at a vacuum deposition rate of 5 Å/sec through a mask of 2 mm±2 mm to obtain an Mg—Al alloy electrode with the size of 2 mm×2 mm and the thickness of 135 nm whereby a light-emitting diode was fabricated. A DC voltage of 16 V was applied between the electrodes of the diode, with the result that an emission of green light with the brightness of more than 900 Cd/m² was obtained. The luminous efficiency was approximately 0.15 lm/W at the brightness of 42 Cd/m². The maximum emission wavelength was approximately 510 nm.

Figure 5:
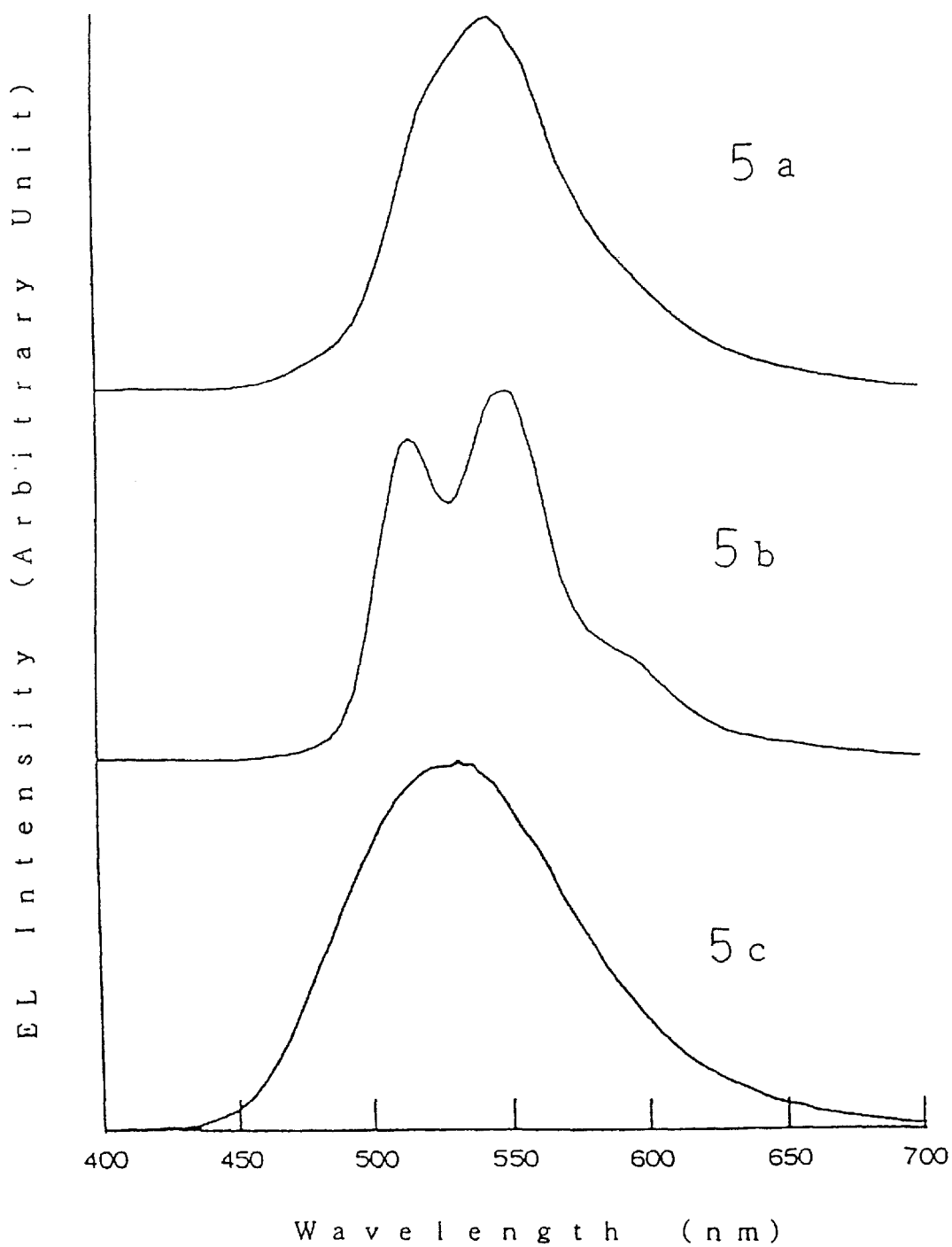
FIG. 5 is a graph showing an EL spectrum of each of the devices obtained in Example 1, Comparative Example 1 and Comparative Example 2.

Comparative Example 1
Measurement of Single EL Spectrum of Alq3
A hole transport material TPD represented by formula (V):

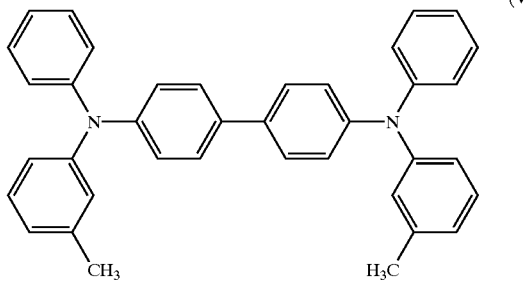

was deposited in a vacuum of $5\times10^{-5}$ torr by resistance heating at a vacuum deposition rate of 3–7 Å/sec. to a thickness of 60 nm on a well-rinsed glass substrate, and then Alq3 shown above in formula (II) was deposited in the same manner as above in a thickness of 50 um. Further, aluminum was deposited in a vacuum of $6\times10^{-6}$ torr by resistance heating at a vacuum deposition rate of 5 Å/sec through a mask of 2 mm×2 mm to produce an aluminum electrode in a thickness of 150 nm whereby a light-emitting diode was prepared. Then, a positive DC voltage was applied to the side of the ITO glass substrate, while a negative voltage was applied to the side of the metal electrode at room temperature in air, and light emitted from the surface of the ITO glass substrate of the diode was observed and the light-emission spectrum thereof was measured. The light emission spectrum obtained is shown in FIGS. 5, 5c.

Comparative Example 2
Measurement of Single EL Spectrum of PPV
80 mg of the intermediate polymer synthesized by the Wessling synthesis method shown above in formula (III) was dissolved in 10 ml of methanol, and the resulting solution was spin-coated on a well-rinsed glass substrate (25 mm×75 mm; thickness: 1.1 mm) at 2,000 rpm for 100 seconds, followed by heat treating in a vacuum of $10^{-5}$ torr at 280° C. for 4 hours to form a thin film of poly (phenylene vinylene) (PPV) having a film thickness of 45 nm on the ITO glass substrate. Then, aluminum was deposited in a vacuum of $4-8\times10^{-6}$ torr by resistance heating at a vacuum deposition rate of 5 Å/sec through a mask of 2 mm×2 mm to produce an aluminum electrode in a thickness of 150 nm whereby a light-emitting diode was prepared. Then, a positive DC voltage was applied to the side of the ITO glass substrate, while a negative DC voltage was applied to the side of the metal electrode, and light-emission spectrum of the diode was measured from the surface of the ITO glass substrate of the diode. The light emission spectrum obtained is shown in FIGS. 5, 5b.

Industrial Applicability
According to the present invention, an organic hetero-pn-junction is formed by appropriately selecting an organic p-type luminescent-semiconductor material and an organic n-type luminescent-semiconductor material, and an organic light-emitting diode having a high luminance and a high luminous efficiency is obtained by using the resulting organic pn-junction.

What is claimed is:

1. An organic light-emitting diode comprising an anode, an organic hetero-pn-junction consisting essentially of two organic light emitting layers, and a cathode layered sequentially in this order, said organic hetero-pn-junction emitting light by an electric current passing through said diode in an electric field applied between said anode and said cathode, characterized in that said organic hetero-pn-junction is composed of an organic p-type luminescent-semiconductor thin film and an organic n-type luminescent-semiconductor thin film and that one surface of said organic p-type luminescent-semiconductor film is in contact with said anode and another surface of said organic p-type luminescent-semiconductor thin film is in contact with said organic n-type luminescent-semiconductor thin film, and one surface of said organic n-type luminescent-semiconductor thin film is in contact with said cathode and another surface of said organic n-type luminescent-semiconductor film is in contact with said organic p-type luminescent-semiconductor thin film, and wherein the two organic light emitting layers are undoped.

2. An organic light-emitting diode according to claim 1, wherein said organic p-type luminescent-semiconductor and said organic n-type luminescent-semiconductor have band-gap energies ranging from 1 eV to 3.5 eV.

3. An organic light-emitting diode according to claim 1, wherein said organic p-type luminescent-semiconductor is made of a poly (arylene vinylene) of formula (I):

wherein Ar represents a substituted or unsubstituted divalent aromatic hydrocarbon group or a substituted divalent heterocyclic group, and said aromatic hydrocarbon group and said heterocyclic group may be a fused ring, and n is an integer of 1 or more.

4. An organic light emitting diode according to claim 3, wherein the poly (arylene vinylene) is poly (phenylene vinylene).

5. An organic light emitting diode according to claim 1, wherein an organic p-type poly (phenylene vinylene) luminescent thin film is prepared from a poly (phenylene vinylene) precurser solution by the steps of spin-coating 40~160 mg/ml of a poly (phenylene vinylene) precurser solution on a well-rinsed ITO substrate under the condition of 1000~3000 rpm for 30~200 seconds, and then subjecting the spin-coated ITO to a heating treatment in a vacuum of $10^{-4}\sim10^{-6}$ torr at a temperature of 200~350° C. for 0.5~10 hours to form a thin film of poly (phenylene vinylene).

6. The organic light emitting diode according to claim 5, wherein an organic p-type poly (phenylene vinylene) luminescent thin film is prepared from a poly (phenylene vinylene) precurser solution by spin-coating 70~90 mg/ml of a poly (phenylene vinylene) precurser solution.

7. The organic light emitting diode according to claim 5, wherein the spin-coating step is conducted under the condition of 1800~2200 rpm.

8. The organic light emitting diode according to claim 5, wherein the spin-coating step is conducted for 80~120 seconds.

9. The organic light emitting diode according to claim 5, wherein the heating treatment step is conducted at a temperature of 260~300° C.

10. An organic light emitting diode according to claim 5, wherein the heating treatment step is conducted for 2~6 hours.

11. An organic light emitting diode according to claim 1, wherein said organic n-type luminescent-semiconductor is made of tris (8-quinolinol) aluminum.

12. An organic light emitting diode according to claim 1, wherein said organic pn-junction is a thin film having a total thickness in the range of from 1 nm to 1000 nm.

13. An organic light-emitting diode according to claim 1, wherein a material for said anode is selected from nickel, gold, platinum, palladium, selenium, iridium or an alloy of any combination thereof, thin oxide, ITO, copper iodide, poly (3-methylthiophene) polyphenylene sulfide, a material for said cathode is selected from silver, lead, tin, magnesium, aluminum, calcium, indium, chromium, lithium or an alloy of any combination thereof.

14. The organic light-emitting diode according to claim 3, wherein Ar represents a substituted or unsubstituted divalent aromatic hydrocarbon group or an unsubstituted divalent heterocyclic group, and said aromatic hydrocarbon group and said heterocyclic group may be a fused ring, and n is an integer of 1 or more.

15. An organic light emitting diode comprising an anode, an organic hetero-pn-junction consisting essentially of two organic light emitting layers, and a cathode layered sequentially in this order, said organic hetero-pn-junction emitting light by an electric current passing through said diode in an electric field applied between said anode and said cathode, characterized in that said organic hetero-pn-junction is composed of an organic p-type luminescent-semiconductor thin film and an organic n-type luminescent-semiconductor thin film, wherein one surface of said organic p-type luminescent-semiconductor thin film is in contact with said anode and another surface of said organic p-type luminescent-semiconductor thin film is in contact with said organic n-type luminescent-semiconductor thin film, and one surface of said organic n-type luminescent-semiconductor thin film is in contact with said cathode and another surface of said organic n-type luminescent-semiconductor thin film is in contact with said organic p-type luminescent-semiconductor thin film and wherein said diode satisfies all the conditions of the following equations 1 to 3:

$$X1 \leq X2 \qquad \text{Equation 1:}$$

$$IP1 \leq IP2 \qquad \text{Equation 2:}$$

$$-0.2 \text{ eV} \leq (IP2-IP1)-(X2-X1) \leq 0.2 \text{ eV} \qquad \text{Equation 3:}$$

wherein X1 denotes an absolute value of the electron affinity of the organic p-type luminescent-semiconductor, X2 denotes an absolute value of the electron affinity of the organic n-luminescent-semiconductor, IP1 denotes an ionization potential of the organic p-type luminescent-semiconductor and IP2 denotes an ionization potential of the organic n-type luminescent-semiconductor, and wherein the two organic light emitting layers are undoped.

* * * * *